United States Patent [19]

Nishizawa et al.

[11] Patent Number: 5,607,875

[45] Date of Patent: Mar. 4, 1997

[54] METHOD OF SEPARATING A SEMICONDUCTOR WAFER WITH DIELECTRICS

[75] Inventors: Masato Nishizawa; Shinichi Hashimoto; Yoshiyuki Sugahara, all of Nagano, Japan

[73] Assignee: Fuji Electric Co., Ltd., Kawasaki, Japan

[21] Appl. No.: 454,918

[22] Filed: May 31, 1995

[30] Foreign Application Priority Data

May 31, 1994 [JP] Japan ................................. 6-117295

[51] Int. Cl.⁶ ...................................................... H01L 21/76
[52] U.S. Cl. .......................... 437/63; 437/62; 437/974; 437/67; 437/64; 148/DIG. 50
[58] Field of Search ................... 437/61, 62, 67, 437/63, 64, 974; 148/DIG. 12, DIG. 50

[56] References Cited

U.S. PATENT DOCUMENTS

| | | | |
|---|---|---|---|
| 5,124,274 | 6/1992 | Ohki et al. | 437/61 |
| 5,336,634 | 8/1994 | Katayama et al. | 437/974 |

FOREIGN PATENT DOCUMENTS

| | | |
|---|---|---|
| 58-199536 | 11/1983 | Japan . |
| 61-05544 | 1/1986 | Japan . |
| 1239870 | 9/1989 | Japan . |

*Primary Examiner*—Trung Dang
*Attorney, Agent, or Firm*—Morrison Law Firm

[57] ABSTRACT

A method for separating a joined substrate type wafer, which wafer is composed of a pair of semiconductor substrates joined through an insulation film, utilizes dielectrics through simple processing steps. Trenches for separating a semiconductor substrate with dielectrics are dug from the surface of the substrate and a dielectrics film is deposited on the surface of the substrate including the trenches. Then poly-crystalline silicon is grown by CVD to a thickness of about 0.5 μm, which is deep enough to fill the trenches. The process time for growing poly-crystalline silicon is shortened, and the processing step for removing the poly-crystalline silicon deposited on the unwanted areas is eliminated by growing the poly-crystalline silicon in the trenches but not on the crystalline surface of semiconductor regions based on the growth rate dependence of the poly-crystalline silicon on the crystallinity of the surface on which the poly-crystalline silicon is grown.

13 Claims, 2 Drawing Sheets

METHOD OF SEPARATING A SEMICONDUCTOR WAFER WITH DIELECTRICS

BACKGROUND OF THE INVENTION

The present invention relates to methods for separating a joined substrate type wafer for integrated circuit apparatuses with dielectrics. More particularly, the present invention relates to a methods of separating, with dielectrics, one of the semiconductor substrates of a wafer joined through an insulation film into a plurality of semiconductor regions which are insulated from each other.

Among conventional integrated circuit apparatuses, junction separation type wafers are usually used for separating the potential of regions housing a "built-in" semiconductor element or circuit. However, since the parasitic effects of known built-in transistors or diodes often cause trouble, and mindful that involved circuits often interfere with each other, dielectrics separation type wafers, especially the above described joined substrate type wafers, have been utilized within the context of integrated circuit apparatuses for high frequency use. Such devices are particularly suited to applications contingent upon high reliability over time.

Utilizing dielectrics separation type wafers to separate the inside of the integrated circuit apparatus into a plurality of mutually separated semiconductor regions shows that this is quite effective when done with dielectrics. Particular interest has been shown this approach among known devices, however, prominent difficulties remain.

The prominence of the extant difficulties among the devices of the prior art is demonstrated by reference to FIG. 3. FIG. 3 shows an example of the typical dielectrics separation type wafer according to the prior art. However, significant issues remain unaddressed among the devices of the prior art. A brief perusal of conventional junction separation wafers clarifies the differences between the subject matters of the present invention and known apparatus.

As shown in FIG. 3, a joined substrate type wafer 10 is comprised of a semiconductor substrate 11, and an (n) type semiconductor substrate 13 jointed on the substrate 11 through an insulation film 12 of silicon oxide, lapped to a predetermined thickness and mirror polished to a thickness of 10 to several tens μm.

The dielectrics separation of the wafer 10 is conducted as follows. Trenches 20 are dug by etching from the surface of the semiconductor substrate 13 down to the insulation film 12 to divide the substrate 13 to a plurality of semiconductor regions 14. The surface of each trench 20 is covered with dielectrics film 30 by thermal oxidation or similar methods which are known to those having a modicum of skill in the art. Subsequently, poly-crystalline silicon 40 is grown by a CVD method, or similar conventional process, so as to completely fill the trench 20 with the poly-crystalline silicon 40.

The deposition of the dielectrics film 30 and the growth of the poly-crystalline silicon 40 are conducted over the entire surface of the wafer 10. The dielectrics separation type wafer 60 of FIG. 3 is completed by removing the poly-crystalline silicon from the surface of the wafer 10. This step is undertaken to treat the entire surface of wafer 10, except the inside of each trench 20. This step involves a dry etching technique known as etching back, and further includes removing the dielectrics film 30 from the upper surface of the wafer 10. This step excludes the surface areas around each of the trenches 20 by chemical etching using a photoresistive film as a mask.

Referring now to FIG. 4, a sectional view showing the semiconductor regions 14 of the wafer 60 separated with dielectrics is shown. In this view, one can see that two MOS transistors are built in. Both transistors are separated by an element isolation film 61 which, is a local oxidizing film (LOCOS). On the left hand side of the local oxide film 61, a (p) type well 71 is diffused for an n-channel transistor. A gate oxide film 72 and gates 73 are disposed for the both transistors. A (p) type source and drain layers 74, 74 and an (n) type well connection layer 77 are disposed for a p-channel transistor shown on the right hand side, and an (n) type source and drain layers 76, 76 and a (p) type well connection layer 75 are disposed for an n-channel transistor shown on the left hand side.

Usually these transistors are covered with an inter-layer insulation film 81, and terminals S, D and G for a source, drain and gate are led out through windows opened in the film 81.

Longstanding problems remain to be solved by the subject matter of the present invention. Although the dielectrics separation type wafer according to the prior art shows an enhanced separation performance in terms of reducing the parasitic effects (or interference), production costs are prohibitive. Thus, each known prior art device has such an expensive cost that none have become accepted as cost efficient enough for practical use.

This is because of the excessively long time involved in separating the substrate of the wafer with dielectrics. This is especially true in attempts to grow the poly-crystalline silicon for filling trenches in removing the poly-crystalline silicon deposited on the unwanted areas.

Another drawback is that among conventional devices, precious areas of the wafer are often occupied by the separation trenches. Although the width of the separation trenches is generally from 5 to 15 μm, the total occupied area is considerably wider, since the trenches are shaped with frames or a lattice surrounding the semiconductor regions.

In order to avoid this, instead of dividing the substrate 13 for each semiconductor element, the substrate 13 is usually divided for each circuit. Each circuit is comprised of a plurality of semiconductor elements as shown in FIG. 4. However, such known separation methods tends to cause the complication that the parasitic effects cannot be completely prevented.

In order to address these longstanding problems, the present invention provides a method of separating a semiconductor wafer with dielectrics. The present invention solves the problems described above which are inherent in known disclosures.

Further, prominent among the drawbacks of known dielectrics separation type wafers are the overall production costs. The present invention likewise reduces the overall cost of the dielectric separation processes, thus enhancing the economic utility of applicants' teachings.

OBJECTS AND SUMMARY OF THE INVENTION

Accordingly it is an object of the present invention to provide a method of separating semiconductor wafers with dielectrics which overcomes the drawbacks of the prior art.

It is further object of the invention to provide a method of separating a first semiconductor substrate into a plurality of semiconductor regions which are insulated from each other at a lower overall production cost.

Briefly stated, a method for separating a joined substrate type wafer, which wafer is composed of a pair of semiconductor substrates joined through an insulation film, utilizes dielectrics through simple processing steps. Trenches for separating a semiconductor substrate with dielectrics are dug from the surface of the substrate and a dielectrics film is deposited on the surface of the substrate including the trenches. Then poly-crystalline silicon is grown by CVD to a thickness of about 0.5 µm, which is deep enough to fill the trenches. The process time for growing poly-crystalline silicon is shortened, and the processing step for removing the poly-crystalline silicon deposited on the unwanted areas is eliminated by growing the poly-crystalline silicon in the trenches but not on the crystalline surface of semiconductor regions based on the growth rate dependence of the poly-crystalline silicon on the crystallinity of the surface on which the poly-crystalline silicon is grown.

According to an embodiment of the invention, there is provided a method of separating a first semiconductor substrate into a plurality of semiconductor regions insulated from each other, the first semiconductor substrate constituting a jointed substrate type wafer for mounting an integrated circuit, the wafer including said first semiconductor substrate joined through an insulation film with a second semiconductor substrate, the method comprising the steps of; digging by dry etching narrow trenches for separating said first semiconductor substrate with dielectrics from the surface of the first semiconductor substrate down to the insulation film, covering the surface of the wafer including the trenches with a dielectrics film, and growing poly-crystalline silicon selectively on the dielectrics film formed on the trench faces, in amounts sufficient to fill the trenches with the poly-crystalline silicon.

According to a further embodiment of the invention, there is provided a method of separating a semiconductor wafer with dielectrics, said wafer including a first semiconductor substrate joined through an insulation film with a second semiconductor substrate, the method comprising the steps of; digging by dry etching narrow trenches for separating said first semiconductor substrate with dielectrics from the surface of said first semiconductor substrate down to said insulation film, covering the surface of said wafer including said trenches with a dielectrics film, and growing poly-crystalline silicon selectively on said dielectrics film formed on the trench faces, whereby to fill said trenches with said poly-crystalline silicon, doping impurity selectively in the surfaces of said poly-crystalline silicon grown on said trench faces, and, annealing said doped surfaces by thermal oxidation, for forming separation films above said trenches.

The above, and other objects, features and advantages of the present invention will become apparent from the following description read in conjunction with the accompanying drawings, in which like reference numerals designate the same elements.

Figure 1A:
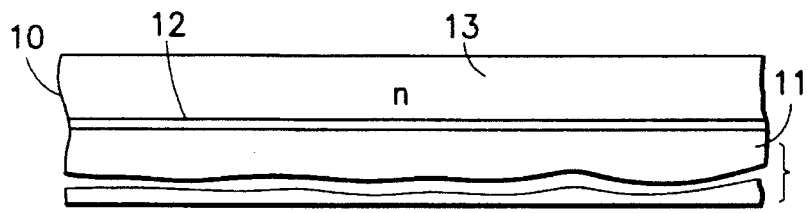
FIG. 1 (a) is a sectional view showing the joined substrate type wafer according to an embodiment of the method of the present invention.
FIGS. 1(b) to 1(d) are sectional views showing the steps of digging and filling the trenches according to an embodiment of the method of the present invention.
FIG. 1(e) is a sectional view showing the step of impurity doping according to an embodiment of the method of the present invention.
FIG. 1(f) is a sectional view showing the step of depositing the separation film according to an embodiment of the method of the present invention.
FIG. 1(g) is a sectional view showing the completed dielectrics separation type wafer according to an embodiment of the method of the present invention.

The present invention will be explained hereinafter with reference to the accompanied drawing figures which illustrate the preferred embodiments of the present invention.

DETAILED DESCRIPTION OF THE PREFERRED EMBODIMENT

The present inventors have discovered that it is preferable to dig the trenches by reactive ion etching method. This is the case because reactive ion etching methods show especially strong etching anisotropy, which confines the width of the trenches within approximately 1 µm and facilitates growth of the poly-crystalline silicon solely inside of the trenches.

The present inventors have discovered that it is preferable to dig the trenches by reactive ion etching method. This is the case because reactive ion etching methods show especially strong etching anisotropy, which confines the width of the trenches within approximately 1 µm and facilitates growth of the poly-crystalline silicon solely inside of the trenches.

The dielectrics film is preferably composed of silicon oxide. For growing the poly-crystalline silicon selectively inside the trenches, it is preferable to remove the dielectrics film from the surface areas of the first semiconductor substrate excluding the trenches.

Likewise, it is preferable to anneal the surface of the semiconductor regions by radiative heating in vacuum so as to improve the crystallinity of the surface of the semiconductor regions.

Since trenches according to the present invention are narrow, it is preferable to use the trenches for dividing the first semiconductor substrate into a plurality of semiconductor regions. It is likewise preferred to build in a semiconductor element of the integrated circuit in each semiconductor region.

In other words, the area necessary for separating between the semiconductor elements of the integrated circuit is considerably reduced by using the dielectrics separation trenches for element isolation in place of the element separation films of the prior art. Irrespective of whether a semiconductor region is assigned to a semiconductor element or a plurality of elements, it is preferable to dope the impurity selectively in the surfaces of the poly-crystalline silicon grown in the trenches and to anneal the doped surfaces by thermal oxidation so as to facilitate the forming of separation films having greater withstand voltage and smaller area above the trenches.

Further, according to the present invention, the step of removing the poly-crystalline silicon from the surface of the semiconductor regions is eliminated by utilizing the growth rate dependence of the poly-crystalline silicon on the crystallinity of the surface on which the poly-crystalline silicon is deposited.

This is further done by selectively growing the poly-crystalline silicon solely inside the trenches. Although the poly-crystalline silicon can be grown by CVD methods at high growth rates on the poly-crystalline dielectrics film which covers the trench faces. The poly-crystalline silicon grows extremely slowly on the crystalline surface of the semiconductor regions. While the poly-crystalline silicon grows to a thickness of 0.5 μm or less, the growth of the poly-crystalline silicon on the crystalline surface of the semiconductor regions is practically negligible.

Based on the growth characteristics of the poly-crystalline silicon (which were just described) the separation of the semiconductor substrate into a plurality of regions commences by digging narrow trenches from the surface of the first semiconductor substrate down to the insulation film. The next step is covering the surface of the wafer including the trenches with a dielectrics film, and growing poly-crystalline silicon selectively on the dielectrics film formed inside faces of the trench so as to fill the trenches with the poly-crystalline silicon.

Since the trench width is narrower than the trench width according to the prior art, the process time for filling the trench is shortened as compared with the prior art. Further, since the poly-crystalline silicon does not grow on the semiconductor region, the removal process is eliminated and the process time is further shortened.

Referring now to FIG. 1(a), a wafer 10 before dielectric separation is shown. The wafer 10 is obtained by joining an (n) type semiconductor substrate 13 with resistivity of 10 to 20 Ω cm at 1000 degrees C. with an appropriate semiconductor substrate 11.

This is done through an insulation film 12 of 1 μm in thickness made of silicon oxide, by lapping the substrate 13 to a desired thickness of around 10 μm and by mirror polishing the surface of the substrate 13.

Figure 1B:
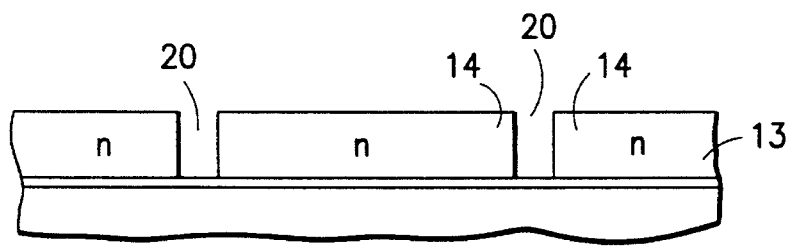

Referring now to FIG. 1(b) the wafer 10 is shown after trenches have been dug. In digging the trenches, the substrate 13 is divided into a plurality of semiconductor regions 14 by digging trenches 20 deep down to the insulation film 12 in a narrow width by a dry etching method.

In preparation for this step, it is preferable to initially cover the surface of the wafer 10 with a thin oxide film for contamination prevention. This film should have a thickness of approximately 0.05 μm and be created by thermal oxidation, and to implant $B_{11}$ under an acceleration voltage of 80 keV and at a dosage amount of $1.2 \times 10^{13}$ atoms/cm$^2$.

It is then preferable to spin coat a photoresistive film on the oxide film, open windows shaped with the trench pattern through the photoresistive film, and then, remove the oxide film in the windows by dry etching. It is preferable to utilize a reactive ion etching method, which uses $SF_6$ as the etching gas and is highly advantageous for anisotropic etching. This is also important for accurately digging the narrow trenches 20 deeply using the photoresistive film as the masking element.

Figure 1C:
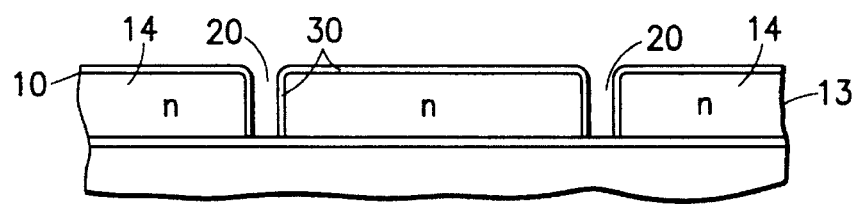

According to the present invention, since it is preferable to dig each of the trenches 20 within a width of about 1 μm, or less [following the step of insulating the trenches which is explained in detail in FIG. 1(c)], it is preferable to set the width of the windows opened through the photoresistive film at 1 to 1.5 μm.

From FIG. 1(b) on, the width of the windows is exaggerated in comparison with their depth for the sake of clear illustration. After the trenches 20 have been dug, the photoresistive film is removed initially, and then the thin oxide film is removed with dilute hydrofluoric acid from the surfaces of the semiconductor regions 14 as shown in FIG. 1(b).

Referring now to FIG. 1(c) trenches 20 are shown as already insulated. In the step of insulating the trenches, the entire surface of the wafer 10 including the inside faces of each of the trenches 20 and the surface of the semiconductor regions 14 are covered with a dielectrics film 30. Conventional silicon oxide films may be used as the dielectrics film 30. Such silicon oxide film thickness is preferably set at about 0.3 μm, corresponding to the withstand voltage necessary between the semiconductor regions 14, 14.

To obtain a dielectrics film 30 having an improved and enhanced film quality, the oxide film is formed by a pyrogenic method. Such a pyrogenic method uses $H_2$ and $O_2$, under atmospheric pressure at from about 800 to 850 degrees C. for 3 hrs.

Figure 1D:
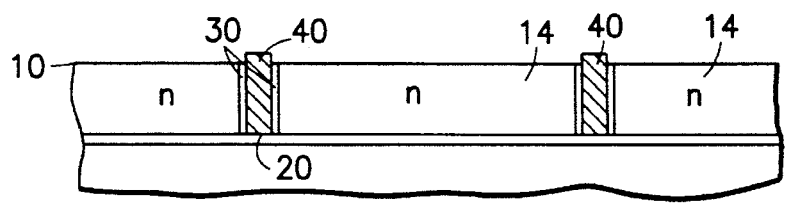

Referring now to FIG. 1(d), the wafer 10 is shown in a state in which each of the trenches 20 have been filled. According to the method of the present invention, during a filling step, each of the trenches 20 are filled with poly-crystalline silicon 40 grown selectively on the dielectrics film 30. During this step, it is preferable to expose the crystalline surface of the semiconductor regions 14 in advance so as to grow the poly-crystalline silicon 40 solely inside the trenches 20 but so as not to grow the poly-crystalline silicon 40 on the other parts of the wafer 10.

In order to expose the crystalline surface of the semiconductor regions 14, the dielectrics film 30 on the semiconductor regions is exclusively etched and removed a reactive ion etching method. This is preferably done under a reduced pressure of 1 to several mTorr in a mixed gas environment containing $C_2ClF_5$ and $O_2$, and then the disorder of the surface crystallinity is annealed out by heating at approximately 1000 degrees C. in vacuum for 2 min. with a lamp.

The poly-crystalline silicon 40 is grown by the CVD method using a silane reaction gas under reduced pressure of 0.3 Torr at 620 degrees C. A growth time is set at about 2 hrs so as to maintain a film thickness of around 0.5 μm or less. Under the growth conditions described above, the poly-crystalline silicon 40 does not grow on the surface of the semiconductor regions 14, especially not on the crystalline surface. The poly-crystalline silicon 40 grows solely from the dielectrics film 30, and in each of the trenches 20 and completely fills the trenches 20 from both sides as shown in the figure.

Figure 1E:
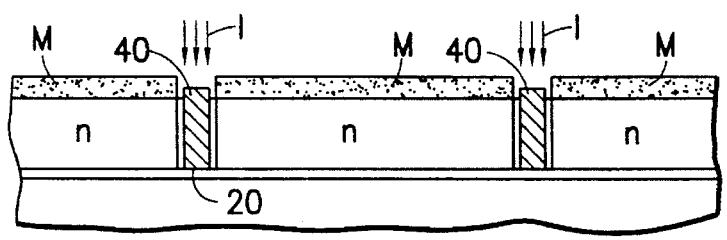

Referring now to FIG. 1(e), a preparatory impurity doping step for the growth of the separation film 50 is shown. In this step, (n) or (p) type impurity I is doped by ion-implantation in the poly-crystalline silicon 40. As a preparatory step for the ion implantation, a thin oxide film is deposited in the state of FIG. 1(d) on the entire surface of the wafer 10 to a thickness of 0.02 μm, a photoresistive film for the masking M of FIG. 1(e) is coated to a thickness of around 0.7 μm, windows are opened corresponding to each of the trenches 20, and the oxide film is removed from above the poly-crystalline silicon 40 by etching back in $O_2$ or in a gas mixture of $CF_4$ and $O_2$.

$As_{75}$ is preferable for impurity I. The surface area of the poly-crystalline silicon 40 is heavily doped with $As_{75}$ by shallow implantation of $As_{75}$ at an acceleration voltage of 70 keV and at a dose amount of $3 \times 10^{15}$ atoms/cm$^2$.

An (n) type impurity $P_{31}$ or a (p) type impurity $B_{11}$ may be used as the impurity I per the requirements of the individual application. After doping the impurity I, the masking M is removed by ashing, and the oxide film by etching back.

Figure 1F:
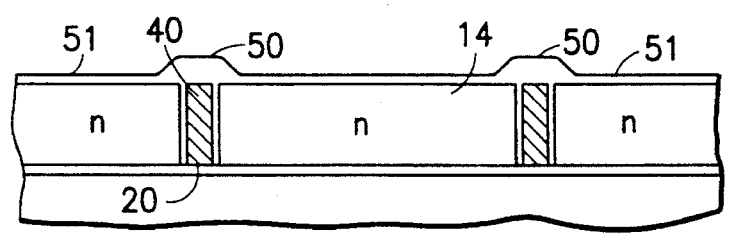

Referring now to FIG. 1(f), although the separation of the wafer 10 with dielectrics is substantially completed through the steps described so far, a separation film 50 of silicon oxide is formed over each of the trenches 20. During the separation film deposition process of FIG. 1(f), the surfaces of the poly-crystalline silicon 40 and the semiconductor regions 14 are oxidized by the pyrogenic oxidation method at 800 degrees C. for about 2 hrs. The oxide film is deposited in this step to a thickness of 0.3 ×m as the separation film 50 on the poly-crystalline silicon 40 doped with the impurity I, but to an extremely thin thickness of 0.05 ×m as designated by reference numeral 51 on the semiconductor region 14.

Figure 1G:
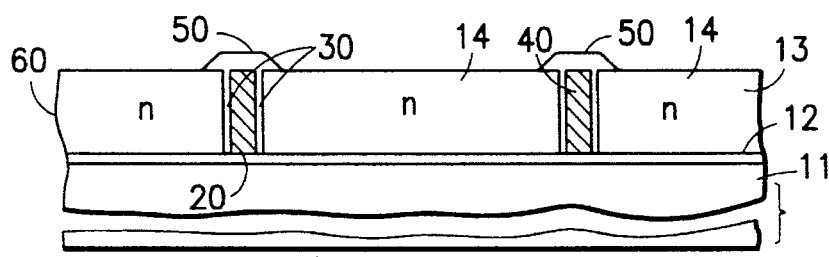

Referring now to FIG. 1(g), a completed wafer 10 is shown as a dielectrics separation type wafer 60. To bring the wafer 10 to this completed state, the very thin oxide film 51 is removed from the surface of the semiconductor regions 14 with hydrofluoric acid, leaving the separation film 50 unremoved.

However, when MOS transistors are built in the wafer 60, it is preferable to regulate the surface impurity concentration of the semiconductor region in advance to the removal of the oxide film 51 by shallowly implanting ions at a dose amount of $2.8 \times 10^{12}$ atoms/cm$^2$ from $BF_2$ under an acceleration voltage of 65 eV.

Figure 2:
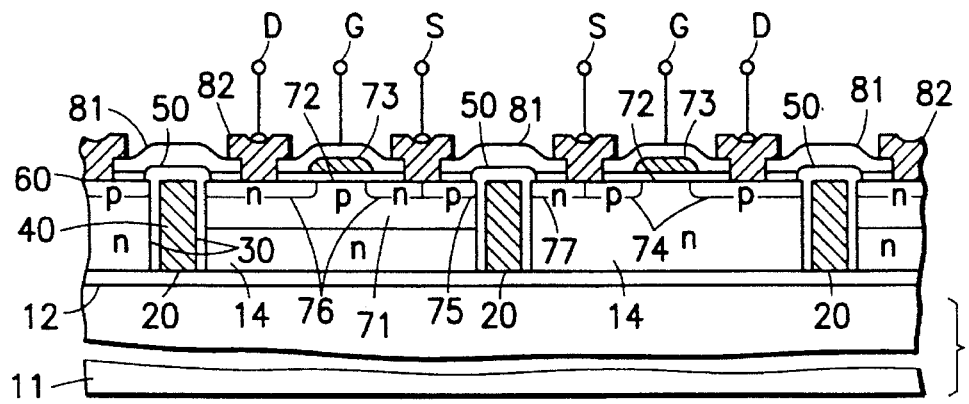
FIG. 2 is a sectional view expanding the main part of the wafer of FIGS. 1(a) through 1(g) into which the integrated circuit is built in according to an embodiment of the method of the present invention.
Figure 3:
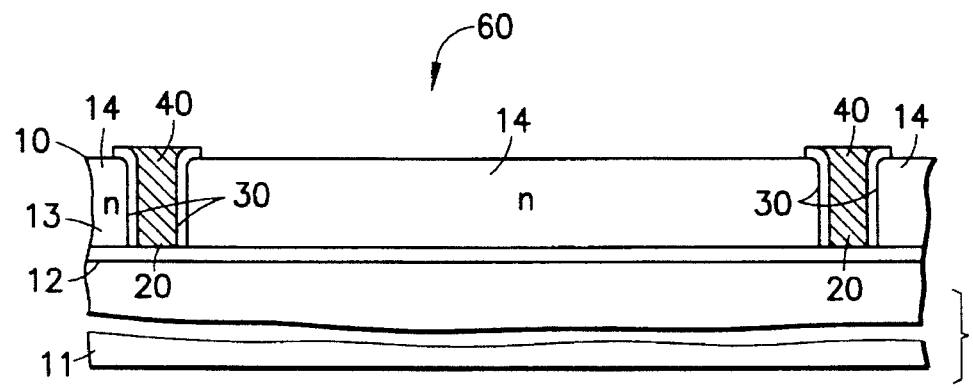
FIG. 3 is a sectional view showing an example of the typical dielectrics separation type wafer according to the prior art.

Referring now to FIG. 2, the wafer 60 is separated with dielectrics in which MOS transistors are built in. In the embodiment shown in the FIG. 2, a p-channel MOSFET is built in a semiconductor region 14 on the right hand side of the figure and an n-channel MOSFET on the left hand side. The processes for building in these elements is further detailed in the discussion directly below.

Initially, a (p) type well 71 is diffused to a depth of about 4 μm in the left hand side region 14 in which the n-channel MOSFET is to be built in. Then a gate oxide film 72 is deposited to a thickness of 0.025 μm, phosphorus doped poly-crystalline silicon is grown for gates 73, 73 to a thickness of 0.3 μm, and the poly-crystalline silicon is annealed at 900 degrees C. for 20 min.

The annealed poly-crystalline silicon is shaped with the gates 73, 73 by photo-etching, and the damages caused by the etching are removed by annealing the shaped poly-crystalline silicon in an $N_2$ gas at about 900 degrees C. for 10 min.

Preferably, the gates are oxidized to form on the lower side edges of their respective end faces a shadow oxide film to a thickness of about 0.02 μm to improve the withstand voltage.

Then, source and drain layers 74, 74 and a substrate connection layer 77 of the p-channel transistor, and source and drain layers 76, 76 and a substrate connection layer 75 of the n-channel transistor are formed by implanting (n) type and (p) type impurities through the photoresistive masking. An oxide film of approximately 0.12 μm in thickness and a borophosphosilicate glass film of 0.65 μm are deposited by a CVD method at 800 degrees C. to form an inter-layer insulation film 81.

A titanium film of about 0.02 μm in thickness, titanium nitride film of about 0.1 μm in thickness and an aluminum film of about 0.5 μm containing 1% of Si and 0.3% of Cu are deposited to form a wiring film 82 and the wiring film 82 is patterned to form terminals of a source S, drain D and gate D. Thus, the MOSFETs are built in as illustrated in FIG. 2.

Figure 4:
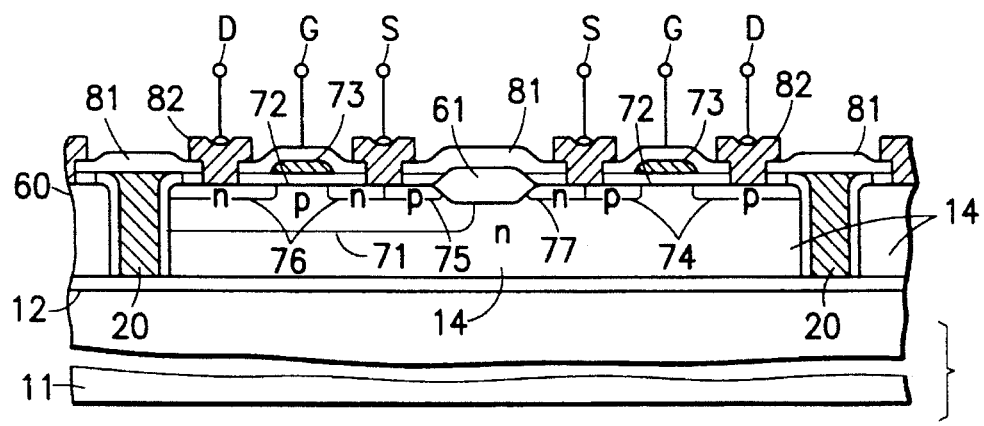
FIG. 4 is a sectional view expanding the main part of the wafer of FIG. 3 into which an integrated circuit is built in according to the prior art typical dielectrics separation type wafer.

In the integrated circuit of FIG. 2 built into the dielectrics separation type wafer 60 according to the present invention, the width of each of the trenches 20 for the dielectrics separation is narrowed to less than a quarter of the width of the conventional integrated circuit of FIG. 4. Therefore, the necessary area for building in the integrated circuit is narrowed. By separating the semiconductor regions 14 at every semiconductor element, the aforementioned parasitic effect and interference between the circuit are practically completely prevented. Besides, the area necessary for separating the semiconductor elements from each other is more narrowed than that for the element separation film 61 of FIG. 4, and some steps for forming the element separation film 61 are eliminated.

Usually, the element separation film 61 is built in by a known, selective oxidation method, which requires the deposition and patterning of the nitride masking film, impurity diffusion for the channel stopper, the high temperature thermal oxidation of the element separation film and removal of the nitride film by dry etching. In contrast, the present invention facilitates separating simultaneously the wafer 60 with dielectrics and the elements from each other.

Though not shown in FIG. 2, the wiring film 82 is usually covered with a protection film. An oxide film about 0.1 μm in thickness, phosphorus silicate glass about 0.3 μm in thickness and silicon nitride film about 1 μm in thickness are formed, and windows are opened through the film lamination composite for the terminals of the connection pads etc. in the predetermined positions of the composite. Though the constituent element of the integrated circuit is explained by way of a MOS transistor, the constituent element such as a DMOS transistor, bipolar transistor, insulated gate bipolar transistor, etc. may be built in the wafer 60 separated with dielectrics.

Since the dielectrics separation type wafer is well suited for the MOS transistors with the so-called LDD (lightly doped drain) structure, the manufacturing process for the transistor will be briefly explained below. At first, the joined substrate type wafer 10, the substrate 13 of which has an appropriate thickness is processed to the dielectrics separation type wafer 60 through the above described steps. After the gates 73, 73 are disposed, the (n) type impurity such as P31 is implanted under the acceleration voltage of 30 keV at the dose amount of $3 \times 10_{13}$ atoms/cm$^2$ using a photoresistive film for forming the source and drain layers 76, 76 as the masking. After removing the photoresistive film, an oxide film is formed to a predetermined thickness by CVD at 800 degrees C.

The oxide film is removed by etching back leaving space oxide films by a width of around 0.2 μm on the side walls of the gate 73. Then the (n) type impurity is implanted for forming the source and drain using the space oxide films as a part of the masking. The successive steps are the same as those of FIG. 2.

The present invention is further characterized by the above described specific features, and additionally shows the following favorable effects:

i. since it is enough to grow the poly-crystalline silicon so as to fill the narrow trench, the process time for filling the trenches is shortened to less than a quarter of the process time by the prior art;

ii. since the poly-crystalline silicon never grows on the areas other than the trenches, the step of removing the excessive poly-crystalline silicon is eliminated, and the cost of separating the wafer with dielectrics is greatly reduced.

Likewise, the following subsidiary effects are obtained by the present invention:

i. since the area necessary for separating the wafer with dielectrics is reduced, the chip size of the integrated circuit apparatuses is also reduced;

ii. since the amount of the poly-crystalline silicon for filling the trenches is reduced to less than a quarter of the amount by the prior art, bending of the wafer, often caused by the high temperature process of building in the integrated circuit, is eliminated.

The selectivity of the growth of the poly-crystalline silicon to the trenches is improved and the above described effects are enhanced by digging the trenches within the width of about μm, removing the dielectrics film from the surface areas on the semiconductor regions except the trenches and annealing the thus exposed surfaces by radiative heating in vacuum.

The chip size of the integrated circuit apparatuses is reduced through the reduction of separation area between the elements even when the wafer is divided by the trenches into the semiconductor regions, in each of which one semiconductor element is built in. The withstand voltage between the semiconductor regions and the performance of the integrated circuit apparatuses are improved by forming the separation film of silicon oxide through the selective impurity doping in the surface layer of the poly-crystalline silicon in the trenches. And, the manufacturing cost of the integrated circuit apparatuses is reduced by simultaneously conducting the dielectrics separation and the separation between the semiconductor elements.

In summary, the present invention utilizes the growth rate dependence of the poly-crystalline silicon on the crystallinity of the surface on which the poly-crystalline silicon is deposited by the CVD method. In separating the joined substrate type wafer with dielectrics, narrow trenches are dug deeply down to the insulation film from the wafer surface by dry etching, the wafer surface including the inside faces of the trenches is covered with a dielectrics film, and the poly-crystalline silicon is selectively grown by CVD solely on the dielectrics film on the inside faces of the trenches.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A method of separating a first semiconductor substrate into a plurality of semiconductor regions insulated from each other, said first semiconductor substrate constituting a jointed substrate type wafer for mounting an integrated circuit, said wafer including said first semiconductor substrate joined through an insulation film with a second semiconductor substrate, the method comprising the steps of:

dry etching trenches, for separating said first semiconductor substrate with dielectrics, from a surface of said first semiconductor substrate down to said insulation film;

covering said surface including said trenches with a dielectrics film;

removing said dielectrics film from said surface, excluding said trenches; and growing poly-crystalline silicon selectively on said dielectrics film remaining on faces of said trenches, thereby filling said trenches with said poly-crystalline silicon.

2. The method as claimed in claim 1, wherein said step of digging further includes said trenches being confined to a width of about 1 μm.

3. The method as claimed in claim 1, wherein said step of covering includes said dielectrics film further comprising silicon oxide.

4. The method as claimed in claim 1, wherein said step of removing includes reactive ion etching.

5. The method as claimed in claim 1, further including annealing said surface by radiative heating in vacuum following said step of removing said dielectrics film from said surface.

6. The method as claimed in claim 1, wherein said first semiconductor substrate is divided into a plurality of semiconductor regions, wherein each of said plurality of semiconductor regions has a semiconductor element of said integrated circuit built in.

7. The method as claimed in claim 1, further comprising the steps of:

doping impurity selectively in the surfaces of said poly-crystalline silicon grown on said trench faces; and, annealing said doped surfaces by thermal oxidation, for forming separation films above said trenches.

8. The method as claimed in claim 2, further comprising the steps of:

doping impurity selectively in the surfaces of said poly-crystalline silicon grown on said trench faces; and, annealing said doped surfaces by thermal oxidation, for forming separation films above said trenches.

9. The method as claimed in claim 3, further comprising the steps of:

doping impurity selectively in the surfaces of said poly-crystalline silicon grown on said trench faces; and, annealing said doped surfaces by thermal oxidation, for forming separation films above said trenches.

10. The method as claimed in claim 4, further comprising the steps of:

doping impurity selectively in the surfaces of said poly-crystalline silicon grown on said trench faces; and, annealing said doped surfaces by thermal oxidation, for forming separation films above said trenches.

11. The method as claimed in claim 5, further comprising the steps of:

doping impurity selectively in the surfaces of said poly-crystalline silicon grown on said trench faces; and, annealing said doped surfaces by thermal oxidation, for forming separation films above said trenches.

12. The method as claimed in claim 6, further comprising the steps of:

doping impurity selectively in the surfaces of said poly-crystalline silicon grown on said trench faces; and, annealing said doped surfaces by thermal oxidation, for forming separation films above said trenches.

13. A method of separating a semiconductor wafer with dielectrics, said wafer including a first semiconductor substrate joined through an insulation film with a second semiconductor substrate, the method comprising the steps of:

dry etching trenches, for separating said first semiconductor substrate with dielectrics, from a surface of said first semiconductor substrate down to said insulation film;

covering said surface, including said trenches, with a dielectrics film;

removing said dielectrics film from the surface of said wafer, excluding said trenches; and growing poly-crystalline silicon selectively on said dielectrics film formed on faces of said trenches, thereby filling said trenches with said poly-crystalline silicon;

doping impurity selectively in surfaces of said poly-crystalline silicon grown on said trench faces;

annealing said surfaces of said poly-crystalline silicon; and forming separation films above said trenches by thermal oxidation.

* * * * *